US007678532B2

(12) United States Patent
Asou et al.

(10) Patent No.: US 7,678,532 B2
(45) Date of Patent: Mar. 16, 2010

(54) METHOD OF PROCESSING A SUBSTRATE

(75) Inventors: Yutaka Asou, Ozu-Machi (JP);
Masatoshi Shiraishi, Ozu-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 565 days.

(21) Appl. No.: 11/680,957

(22) Filed: Mar. 1, 2007

(65) Prior Publication Data
US 2007/0207405 A1 Sep. 6, 2007

(30) Foreign Application Priority Data
Mar. 3, 2006 (JP) ............................. 2006-057515

(51) Int. Cl.
*G03F 7/00* (2006.01)
*G03F 7/26* (2006.01)
*G03F 7/40* (2006.01)
*G03F 7/36* (2006.01)
(52) U.S. Cl. ................... 430/270.1; 430/330; 430/331; 430/311; 430/317; 430/318; 430/322
(58) Field of Classification Search .............. 430/270.1, 430/311, 317, 318, 322, 330, 331
See application file for complete search history.

(56) References Cited
U.S. PATENT DOCUMENTS

| 5,618,384 | A * | 4/1997 | Chan et al. ................... 438/597 |
| 6,756,187 | B2 * | 6/2004 | Kido ........................... 430/322 |
| 2002/0106825 | A1 * | 8/2002 | Lee et al. ...................... 438/30 |
| 2003/0129548 | A1 * | 7/2003 | Kido ........................... 430/327 |
| 2003/0219660 | A1 * | 11/2003 | Ito et al. ........................ 430/30 |
| 2004/0126713 | A1 * | 7/2004 | Shiraishi et al. .............. 430/322 |
| 2005/0008976 | A1 * | 1/2005 | Sakamizu et al. ............ 430/311 |
| 2008/0113473 | A1 * | 5/2008 | Heo et al. .................... 438/149 |
| 2008/0182350 | A1 * | 7/2008 | Lin .............................. 438/30 |

FOREIGN PATENT DOCUMENTS

| JP | 2002-334830 | 11/2002 |
| JP | 2005-108904 | 4/2005 |

OTHER PUBLICATIONS

Machine translation of JP 2005-108094 (no date).*
Machine translation of JP 2002-334830 (no date).*

* cited by examiner

*Primary Examiner*—Amanda C. Walke
(74) *Attorney, Agent, or Firm*—Oblon, Spivak, McClelland, Maier & Neustadt, L.L.P.

(57) ABSTRACT

The present invention provides a method of processing a substrate, comprising a reflow process for forming a desired pattern by dissolving a resist pattern, whereby occurrence of defectives, such as disconnection, can be prevented, and a pattern having an appropriate uniformity can be formed efficiently on each predetermined area desired to be masked. From a photoresist pattern 206 including thicker film portions and thinner film portions, the thinner film portions are removed by a re-developing process. Next, the photoresist so formed by the re-developing process on a backing layer 205 is dissolved such that it passes through a stepped portion 205*a* formed at each edge portion 205*b* of the backing layer 205, thereby masking a predetermined area Tg. Upon masking the predetermined area Tg, the photoresist 206 is dissolved in a first dissolving-speed mode on the backing layer 205, and then after the photoresist to be dissolved reaches the stepped portion 205*a*, the photoresist 206 is dissolved in a second dissolving-speed mode which is slower than the first dissolving-speed mode.

15 Claims, 12 Drawing Sheets

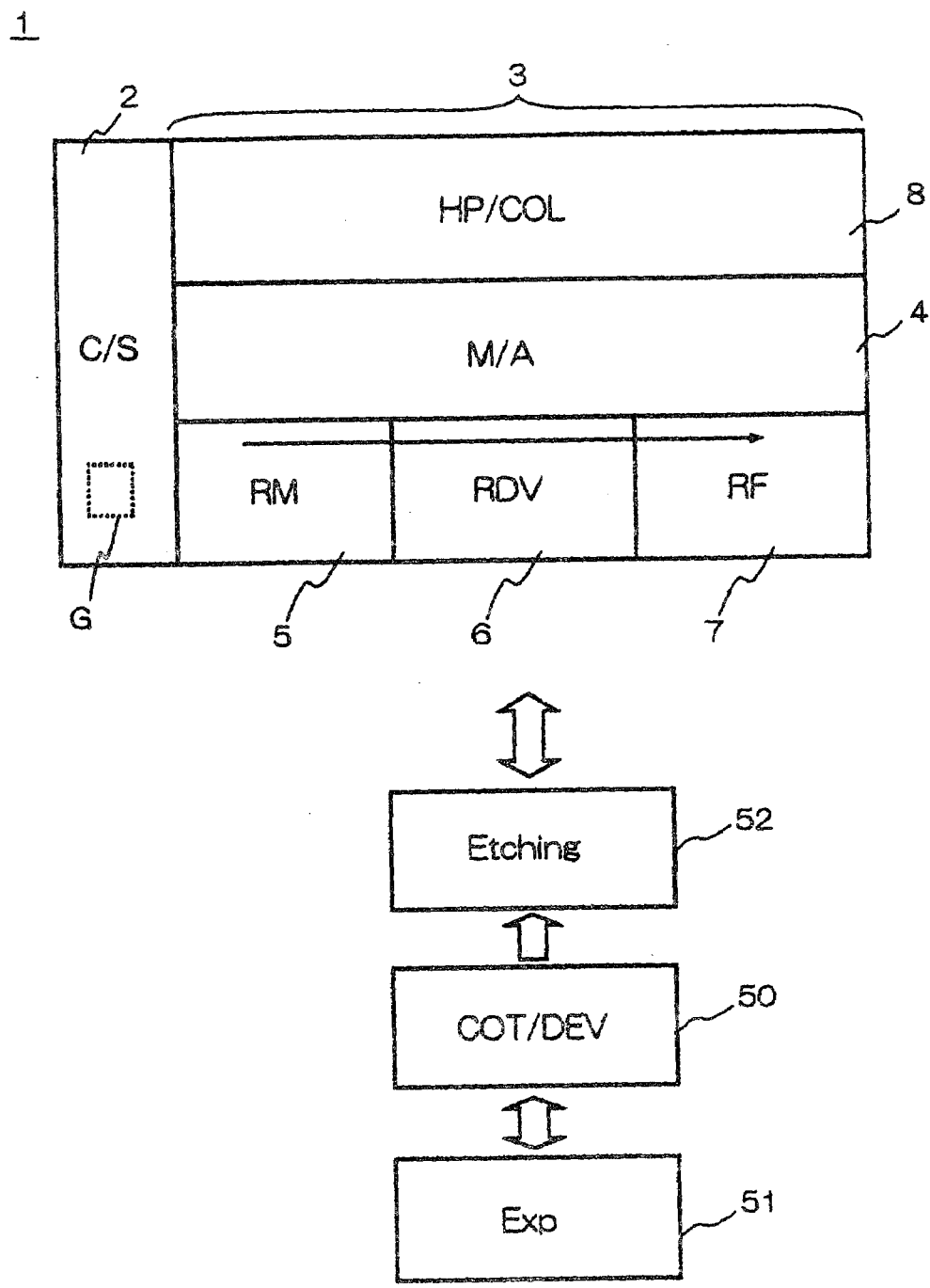
F I G. 1

(a)

(b)

METHOD OF PROCESSING A SUBSTRATE

BACKGROUND OF THE INVENTION

1. Field of the Invention

The present invention relates to a method of processing a substrate, which is adapted to perform a reflow process for forming a new resist pattern by dissolving a used resist pattern which has been formed in a photolithography step and used as a mask.

2. Background Art

For example, in the formation of an amorphous SiTFT (amorphous Silicon Thin Film Transistor) in a step of producing LCDs (Liquid Crystal Displays), multiple photolithography steps are required. Thus, in the past, multiple photolithography steps, i.e., exposing and developing steps, have been performed to form a photoresist pattern.

However, in the step of forming a TFT, a coating and developing apparatus and an exposing apparatus are required for each pattern desired to be obtained by etching, leading to a higher machinery cost.

In view of such an issue, a reflow process has attracted significant attention, in which a new resist pattern can be formed on a predetermined area (target) desired to be masked, by dissolving and changing the form of a resist pattern which has been once used as a mask. With this reflow process, a further process using a coating and developing apparatus and an exposing apparatus is no longer required for forming the second new resist pattern, thus reducing the machinery cost and enhancing the production efficiency.

Patent Document 1: TOKUKAI No. 2005-108904, KOHO

As described above, according to the reflow process, an exposing process using an exposing apparatus is not required upon remaking a resist pattern on a substrate, thereby reducing the production cost and enhancing the production efficiency.

However, in order to form a film having a uniform thickness with a sufficient amount of a resist on a target in the formation of such a new second resist pattern, the resist should be dissolved at an appropriately low speed. Therefore, such a process takes much time, thus degrading the efficiency

SUMMARY OF THE INVENTION

The present invention was made in light of the above problems, and it is therefore an object of this invention to provide a method of processing a substrate, comprising a reflow process for forming a desired pattern by dissolving a resist pattern, wherein occurrence of defects, such as disconnection, can be prevented, and a pattern having a proper uniformity of the film thickness can be formed efficiently on each predetermined area desired to be masked.

The present invention is a method of processing a substrates which is adapted to form a new resist pattern by dissolving a photoresist of a used resist pattern which has been used as an etching mask for forming a backing layer having edge portions and includes at least thicker film portions and thinner film portions both formed by a half exposing process, the method comprising the steps of: providing a re-developing process to the used photoresist pattern to remove the thinner film portions from the photoresist pattern; and further providing a re-developing process to the used photoresist pattern to dissolve the thicker film portions formed on the backing layer to have the dissolved photoresist pass through a stepped portion formed at each edge portion of the backing layer, and masking a predetermined area of lower layers than the backing layer; wherein in the step of masking the predetermined area by the photoresist, the photoresist is dissolved in a first dissolving-speed mode on the backing layer, and the photoresist is then dissolved in a second dissolving-speed mode after the photoersist to be dissolved reaches the stepped portion, the second dissolving-speed mode being slower than the first dissolving-speed mode.

According to this method, since the photoresist is dissolved at a lower speed after it reaches the stepped portion, overflow of the photoresist can be controlled, and a resist film having a proper uniformity of the film thickness can be formed on a predetermined area. Since the photoresist is dissolved at a higher speed until it reaches the stepped portion, the reflow process can be performed more efficiently in a shorter time than dissolving it only in the second dissolving-speed mode.

The present invention is the method of processing a substrate, described above, wherein in the step of masking the predetermined area by the photoresist, after a distal end of the photoresist to be dissolved in the second dissolving-speed mode has passed through the stepped portion, the photoresist is dissolved again in the first dissolving-speed mode.

By applying such a method to the case where the predetermined area desired to be masked is relatively wide, for example, a uniform film thickness can be maintained as well as the processing time can be significantly reduced.

The present invention is the method of processing a substrate, described above, wherein in the step of masking the predetermined area by the photoresist, the photoresist is dissolved by exposing the photoresist to a solvent atmosphere or atmosphere consisting of a solvent.

The present invention is the method of processing a substrate, described above, wherein in the step of masking the predetermined area by the photoresist, the first dissolving-speed mode and the second dissolving-speed mode are respectively determined, depending on any or a combination of the concentration of the solvent atmosphere, flow rate of the solvent atmosphere, substrate temperature and pressure in the treating chamber.

By dissolving the photoresist in the atmosphere consisting of a solvent as described above, quite fine control of the resist dissolution speed can be achieved.

The present invention is the method of processing a substrate, described above, further comprising the step of removing a degenerated layer formed on the surface of the photoresist, by exposing it to an atmosphere consisting of ozone after the photoresist pattern has been used as an etching mask and before the step of removing the thinner film portions by the re-developing process.

In this way, unlike the case of the conventional metal layer, side etching, in which exposed portions (side portions) of the metal layer are dissolved by an alkaline liquid, can be eliminated, and factors which may cause defectives, such as disconnection, can also be eliminated The present invention is the method of processing a substrate, described above, wherein in the step of removing the degenerated layer, the degenerated layer is further removed by radiating UV light onto the degenerated layer.

In this manner, the effect of oxidation and degradation due to ozone can be enhanced more effectively.

According to the present invention, there can be obtained a method of processing a substrate, comprising a reflow process for forming a desired pattern by dissolving a resist pattern, wherein occurrence of defectives, such as disconnection, can be prevented, and a pattern having a proper uniformity of the film thickness can be formed efficiently on each predetermined area desired to be masked.

BRIEF DESCRIPTION OF THE DRAWINGS

FIG. 1 is a plan block diagram showing a layout of a substrate processing apparatus for performing a method of processing a substrate according to the present invention.

DETAILED DESCRIPTION OF THE INVENTION

Figure 2:
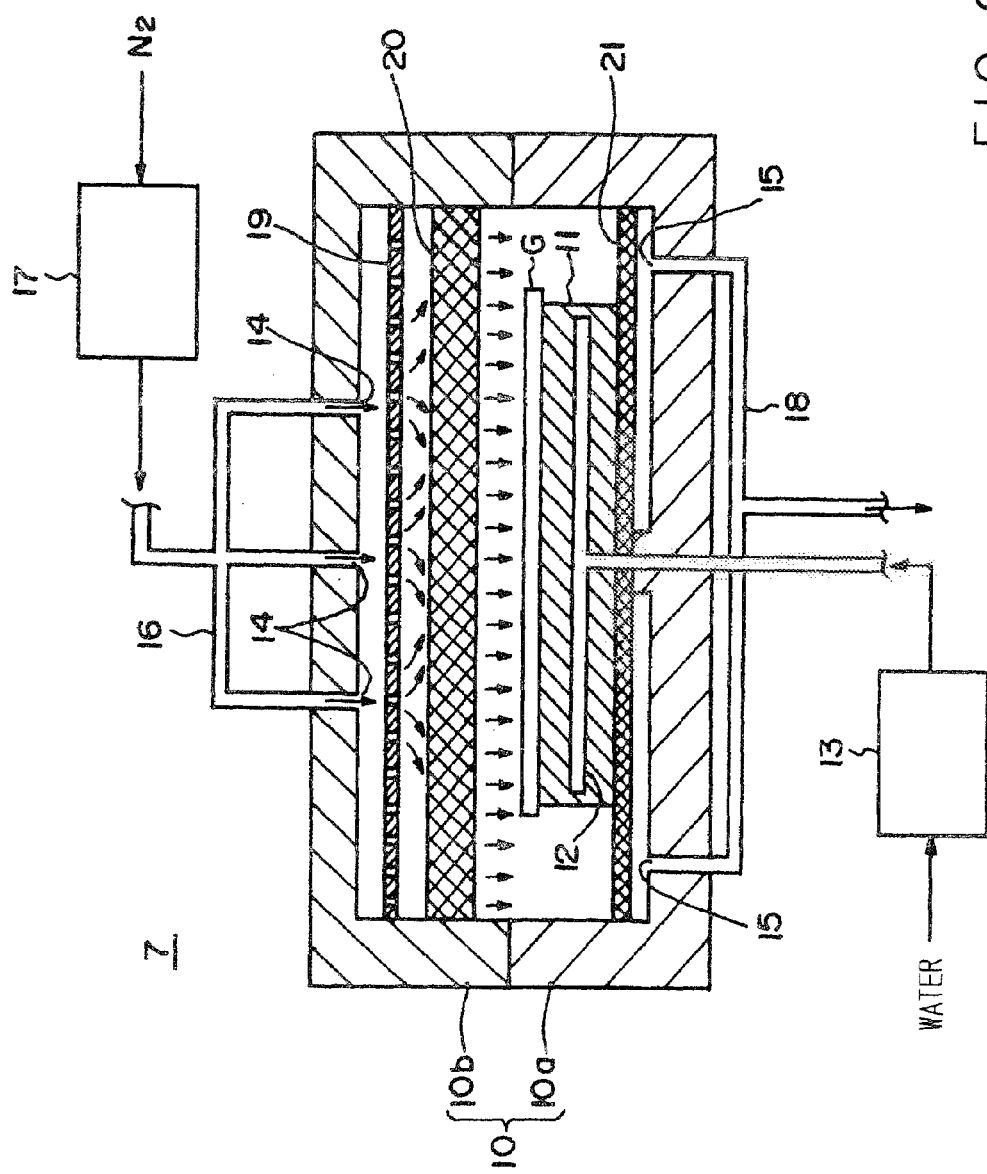
FIG. 2 is a cross section showing a schematic configuration of a reflow unit which constitutes the substrate processing apparatus in FIG. 1.

First, an outline of the process of forming a TFT on a glass substrate by using a reflow process is described with reference to FIGS. 9 to 12.

In the case of forming an amorphous SiTFT, an insulating layer 202, an Si layer 203 comprising an a-Si layer (non-doped amorphous Si layer) 203a and an n$^+$a-Si layer (phosphorus-doped amorphous Si layer) 203b, and a metal layer 205 for forming drain and source electrodes are layered in succession on a glass substrate 220, as shown in FIG. 9(a).

Thereafter, in order to etch the metal layer 205, a photoresist film is formed on the metal layer 205 by a photolithography process, and a resist pattern 206 is then formed through exposing and developing processes. In this case, the resist pattern 206 includes different film thicknesses (i.e., including thicker film portions and thinner film portions) due to a half exposing process using a half tone mask in which portions different from one another in the light transmittance are provided. The half exposing technique is disclosed in the Patent Document 1.

The resist pattern 206 is used as a mask for etching the metal layer 205, and after the etching, the non-masked portions of the metal layer 205 are etched off as shown in FIG. 9(b).

Due to the metal etching, a degenerated layer 207, which is a resist portion degenerated by effect of the wet etching liquid, is formed on the surface of the resist layer 206. As a pre-treatment for the reflow process, a process for removing the degenerated layer 207 is performed.

During the pre-treatment, an alkaline solution is dropped onto the degenerated layer 207 as a wet etching liquid, thereby removing the degenerated layer 207 as shown in FIG. 9(C).

Next, thinner portions of the resist 206, which do not need to be masked in a next resist pattern formation, are removed by a re-developing process as shown in FIG. 9(d), so as to leave only the resist portions (thicker portions) around a target Tg which is desired to be masked.

Thereafter, in the state where the resist 206 is left as shown in FIG. 9(d), a dissolving and spreading process (reflow process) for the resist 206 is performed by exposing the resist 206 to a dissolving atmosphere, so as to form a resist layer on the target Tg as shown in FIG. 9(e).

After the formation of the resist layer, the Si layer 203 is etched using the metal layer 205 as a mask as shown in FIG. 10(a), and the resist layer 206 is then removed as shown in FIG. 10(b). Thereafter, as shown in FIG. 10(c), the n$^+$a-Si layer 203b in the channel region is etched so as to form a TFT.

However, in the reflow process as shown in FIGS. 9(a) to 9(e) and FIGS. 10(a) to 10(c), there is an issue as described below.

First, in the pre-treatment for removing the degenerated layer 207 shown in FIG. 11(a), the degenerated layer 207 is removed by dropping an alkaline liquid 208 onto the degenerated layer 207 as shown in FIG. 11(b). However, in the case where the metal layer 205 is formed of, for example, aluminum, side etching may occur, in which exposed portions of the metal layer 205 are dissolved by the alkaline liquid as shown in FIG. 11(c).

The side etching may further occur in the re-developing process after the pre-treatment process, leading to occurrence of defectives, such as disconnection.

Secondly, when dissolving and spreading the resist from a state shown in FIG. 12(a), the dissolved resist stops moving by the effect of surface tension of the metal layer 205 immediately before the resist passes through a stepped portion 205a formed at each edge portion 205b of the metal layer 205 as shown in FIG. 12(b). At this time, if the resist 206 is rapidly dissolved in order to speed up the process, the resist 206 tends to be spread non-uniformly as shown in FIG. 12(c), as such even unnecessary portions are likely to be masked (hereinafter, this will be referred to as an over-flow state). As a result, a sufficient amount of the resist pattern can not be formed on the target Tg, which may tend to cause non-uniform film thickness.

Hereinafter, a method of processing a substrate according to the present invention will be described with reference to an embodiment as shown in the drawings. FIG. 1 is a plan block diagram showing a layout of a substrate processing apparatus for performing the method of processing a substrate according to the present invention.

The substrate processing apparatus 1 shown in FIG. 1 is adapted to perform a reflow process for a resist pattern in the case of a substrate G which has the resist pattern formed thereon by a coating and developing apparatus (COT/DEV) 50 and an exposing apparatus (EXP) 51 and is subjected to an etching treatment by an etching apparatus 52, in order to form a TFT.

The substrate processing apparatus 1 includes a cassette station (C/S) 2 which is adapted to take out or carry in a plurality of substrates G by each cassette relative to the outside and further transfer the substrates G from or into the cassette.

A substrate processing section 3 is provided adjacent to the cassette station 2, which includes a substrate carrying unit (M/A) 4 including an arm adapted to transfer the substrates G between respective units and take out or carry in the substrates G relative to each unit. Along a substrate processing direction shown by an arrow in the drawing, on both left and right sides of the substrate carrying unit 4, a plurality of processing units are arranged in order to process each substrate G.

As the processing units, a remover unit (RM) 5 adapted to perform a pre-treatment for removing a degenerated layer formed in a photoresist and a re-developing unit (RDV) 6 adapted to remove an unnecessary photoresist by performing a re-developing process are arranged, on the right side, in the drawing, of the substrate carrying apparatus 4, along the processing direction designated by the arrow.

In addition, a reflow unit (RF) 7, which is adapted to form a new photoresist pattern by dissolving a used photoresist, is arranged adjacent to the remover unit 5/re-developing unit 6.

Furthermore, a heat treating unit (HP/COL) 8 comprising a plurality of hot plates and cooling plates is provided, on the left side, in the drawing, of the substrate carrying apparatus 4, along the substrate processing direction.

Since the method of processing a substrate according to the present invention is characterized by a processing method in the reflow unit 7, the reflow unit 7 will be described in more detail hereinafter.

FIG. 2 is a cross section showing a schematic configuration of the reflow unit 7.

As shown in the drawing, in the reflow unit 7, an upper chamber 10b is detachably mounted onto a base chamber 10a so as to form a chamber 10 which will define a closed space in its interior upon the mount of upper chamber 10b.

At a central portion of the chamber 10, a temperature controlling plate 11 adapted to place a substrate G thereon is provided.

In the interior of the temperature controlling plate 11, a temperature controlling water passage 12 is formed, which is adapted to circulate temperature controlling water, and the temperature controlling water passage 12 is connected with a temperature controller 13 provided at the exterior of the chamber. Namely, circulated water is supplied to the temperature controller 13 and adjusted at a predetermined water temperature in the temperature controller 13, thereby to adjust the temperature controlling plate 11 at another predetermined temperature.

In the chamber 10, a thinner gas flow is formed as a solvent atmosphere, which is directed from above to below. Namely, a thinner gas is supplied from a plurality of gas supply ports 14 formed in a ceiling of the upper chamber 10b, and the thinner gas is then discharged from a plurality of gas discharge ports 15 formed in a bottom face of the base chamber 10a.

A gas supply tube 16 is connected with each gas supply port 14 such that a thinner gas, which is adjusted at a proper concentration by a gas concentration adjustor 17, is supplied to the gas supply tube 16. To the gas concentration adjustor 17, a predetermined flow rate of $N_2$ gas is supplied, and a vaporized thinner gas is supplied together with $N_2$ gas to the gas supply tube 16. On the other hand, a gas exhaust tube 18 is connected with each gas discharge port 15 such that the gas contained in the chamber can be discharged therefrom.

In the chamber 10, a diffusion spacer 19 for spreading the thinner gas into the chamber, a leveling plate 20 for leveling the flowing direction of the thinner gas being diffused via the diffusion spacer 19, and an exhaust distribution plate 21 for distributing the gas toward the gas discharge ports 15 are also provided.

In the reflow unit 7 configured as described above, either one of a high-speed dissolving mode (first dissolving-speed mode) and a low-speed dissolving mode (second dissolving-speed mode) is determined and used as a mode of dissolving the resist, depending on any one, or a combination, of the concentration of the thinner gas, flow rate of the thinner gas, temperature of the substrate, and atmospheric pressure in the chamber used as a treating chamber.

For example, in the high-speed dissolving mode, the concentration of the thinner gas supplied into the chamber 10 is set at a higher value (for example, 13,000 ppm) than that in the low-speed dissolving mode. The flow rate of the gas flowing through the chamber 10 is set at a greater value (for example, 20 L/min) than that in the slow-speed dissolving mode. In addition, the atmospheric pressure in the chamber (treating chamber) is set at a higher value (for example, −2 kPa) than that in the low-speed dissolving mode.

Furthermore, the temperature controlling plate 11 is set such that the temperature of the substrate G becomes lower (for example, 20° C.) than the temperature in the chamber. As a result, condensation of the thinner onto the substrate G can be more likely to occur, thereby to more rapidly dissolve the resist.

In the low-speed dissolving mode, the concentration of the gas supplied into the chamber is set at a lower value (for example, 10,000 ppm) than that in the high-speed dissolving mode. The flow rate of the gas flowing though the chamber 10 is set at a smaller value (for example, 10 L/min) than that in the high-speed dissolving mode. Additionally, the atmospheric pressure in the chamber (treating chamber) is set at a lower value (for example, −10 kPa) than that in the high-speed dissolving mode.

Further, the temperature of the temperature controlling plate 11 is set such that the temperature of the substrate G becomes higher (for example, 22° C.) than the temperature in the chamber to avoid occurrence of the concentration onto the substrate G.

Figure 4:
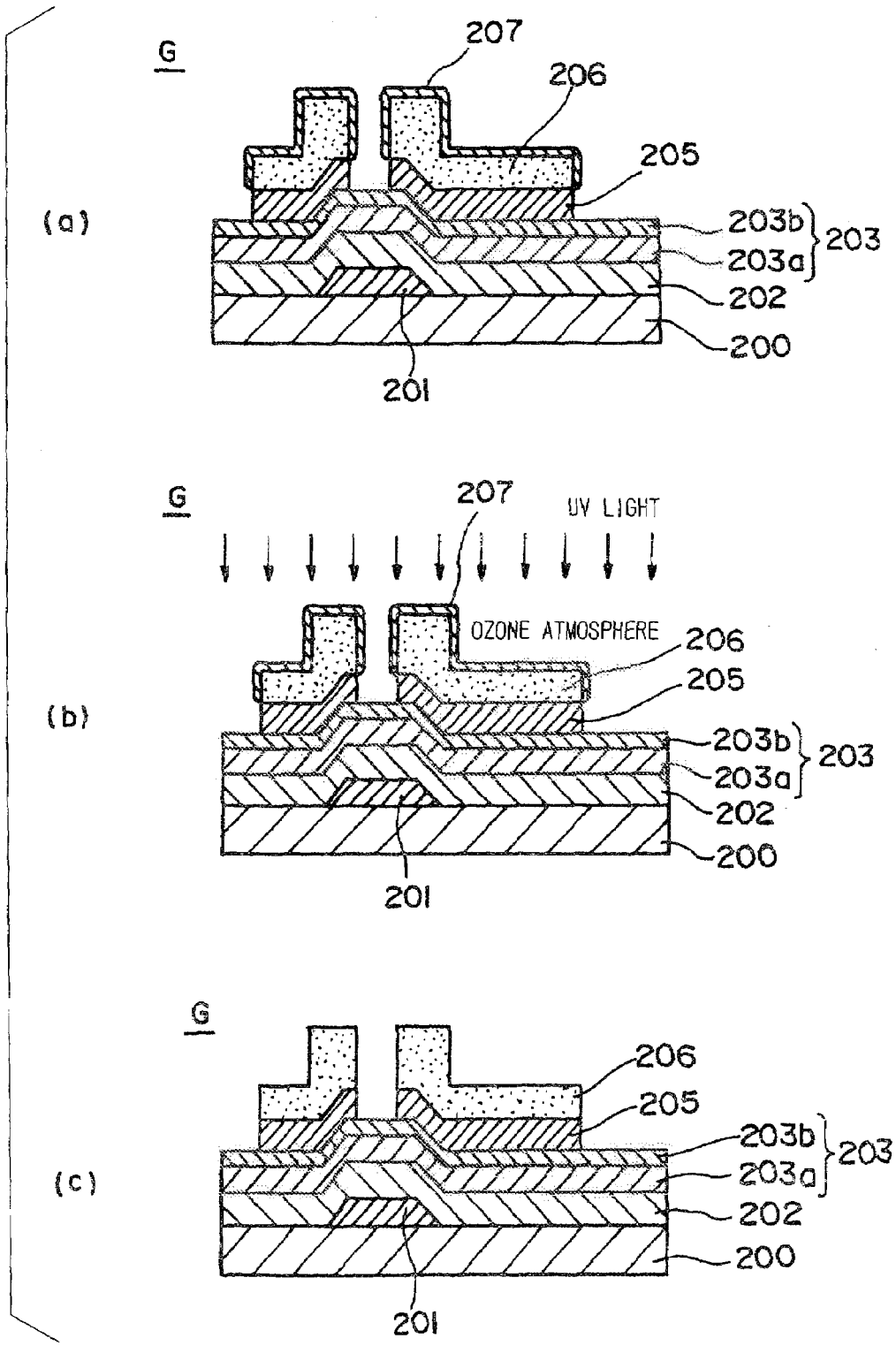
FIGS. 4(a), 4(b) and 4(c) are cross sections respectively showing states of a substrate to be processed in accordance with the flow chart of FIG. 3.
Figure 5:
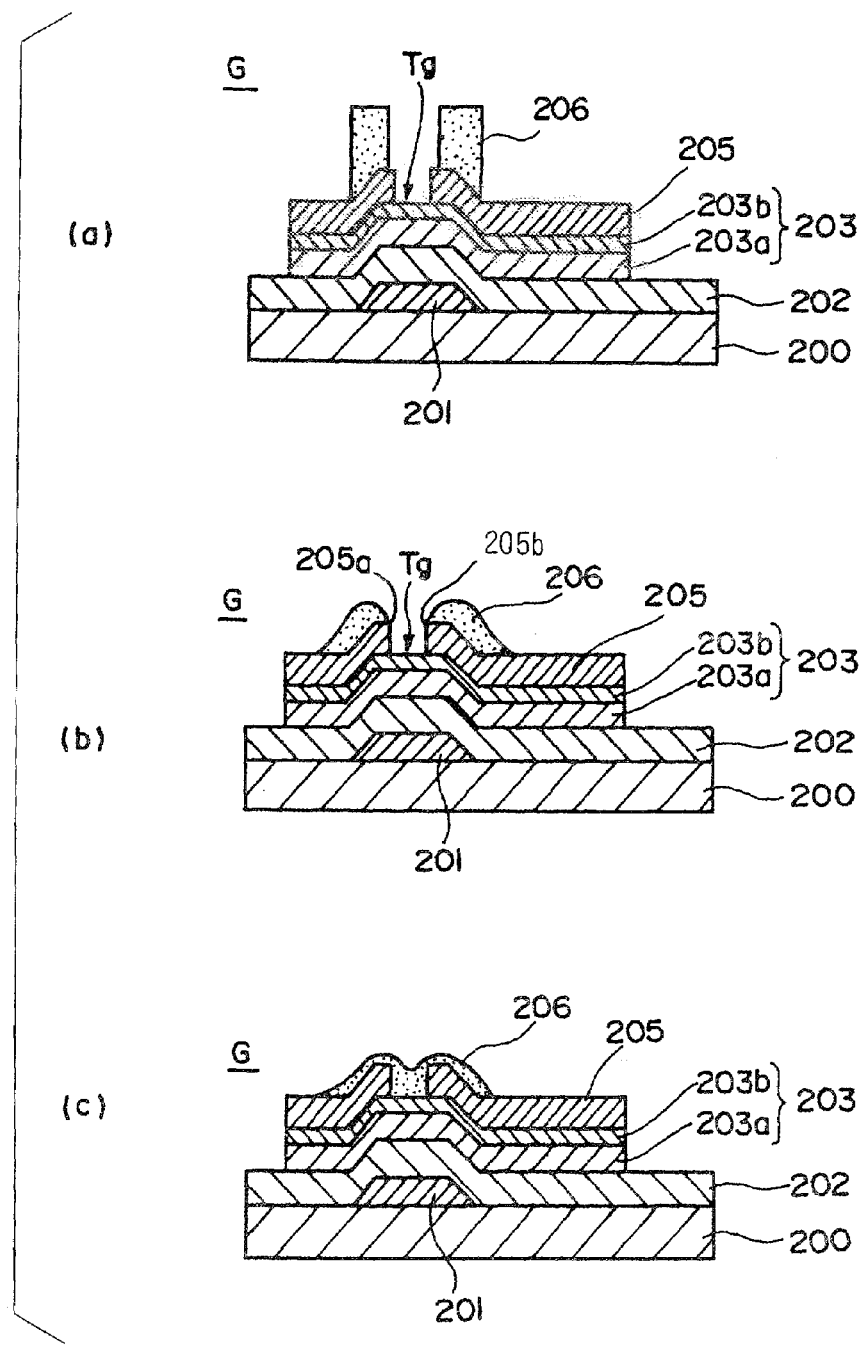
FIGS. 5(a), 5(b) and 5(c) are cross sections respectively showing states of a substrate to be further processed in accordance with the flow chart of FIG. 3.
Figure 9:
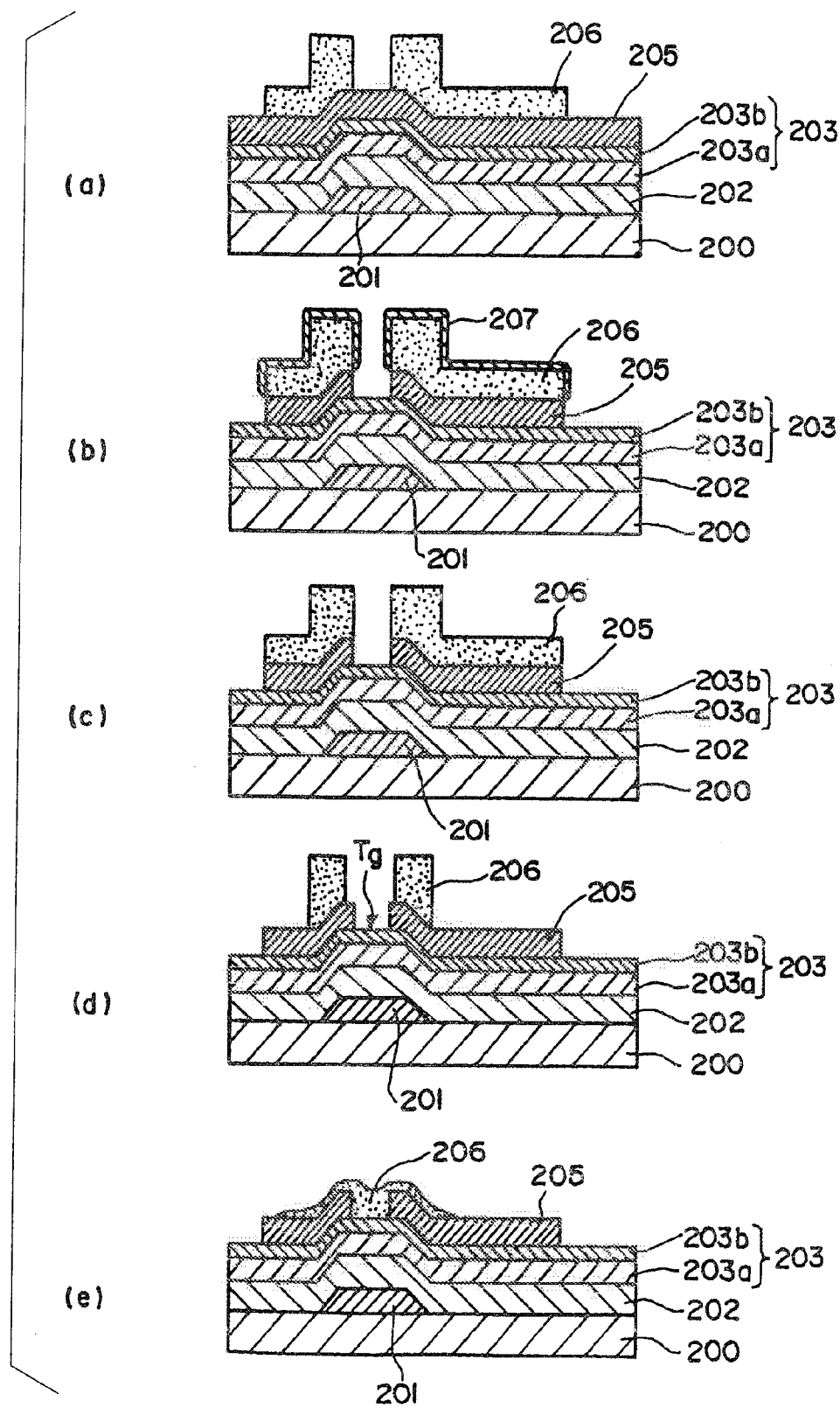
FIGS. 9(a), 9(b), 9(c), 9(d) and 9(e) are cross sections respectively showing states of a substrate, for explaining each process of forming a TFT, which is formed on a glass substrate by the reflow process.
Figure 10:
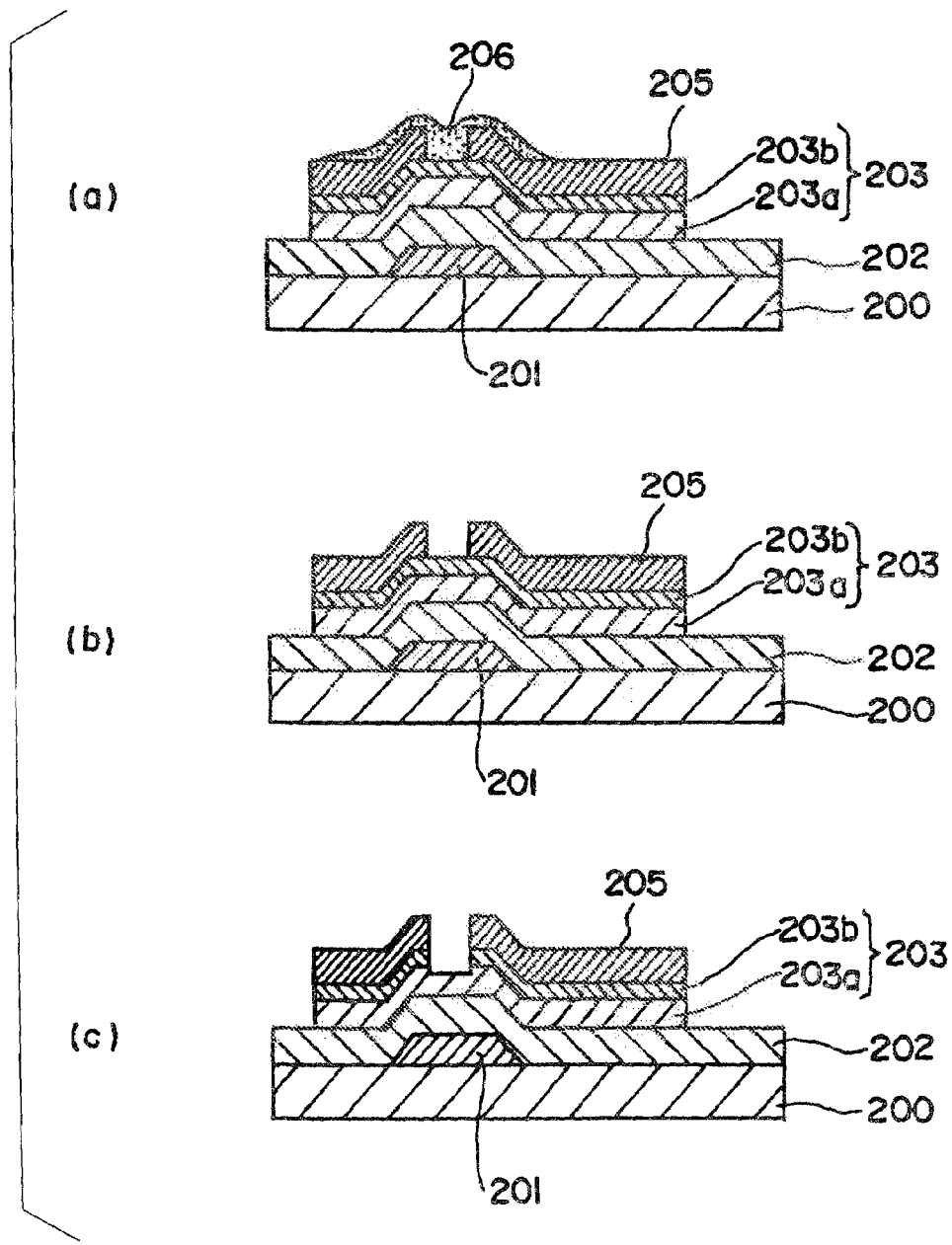
FIGS. 10(a), 10(b) and 10(c) are cross sections respectively showing states of a substrate, for explaining each process of forming a TFT, which is formed on a grass substrate by the reflow process.
Figure 11:
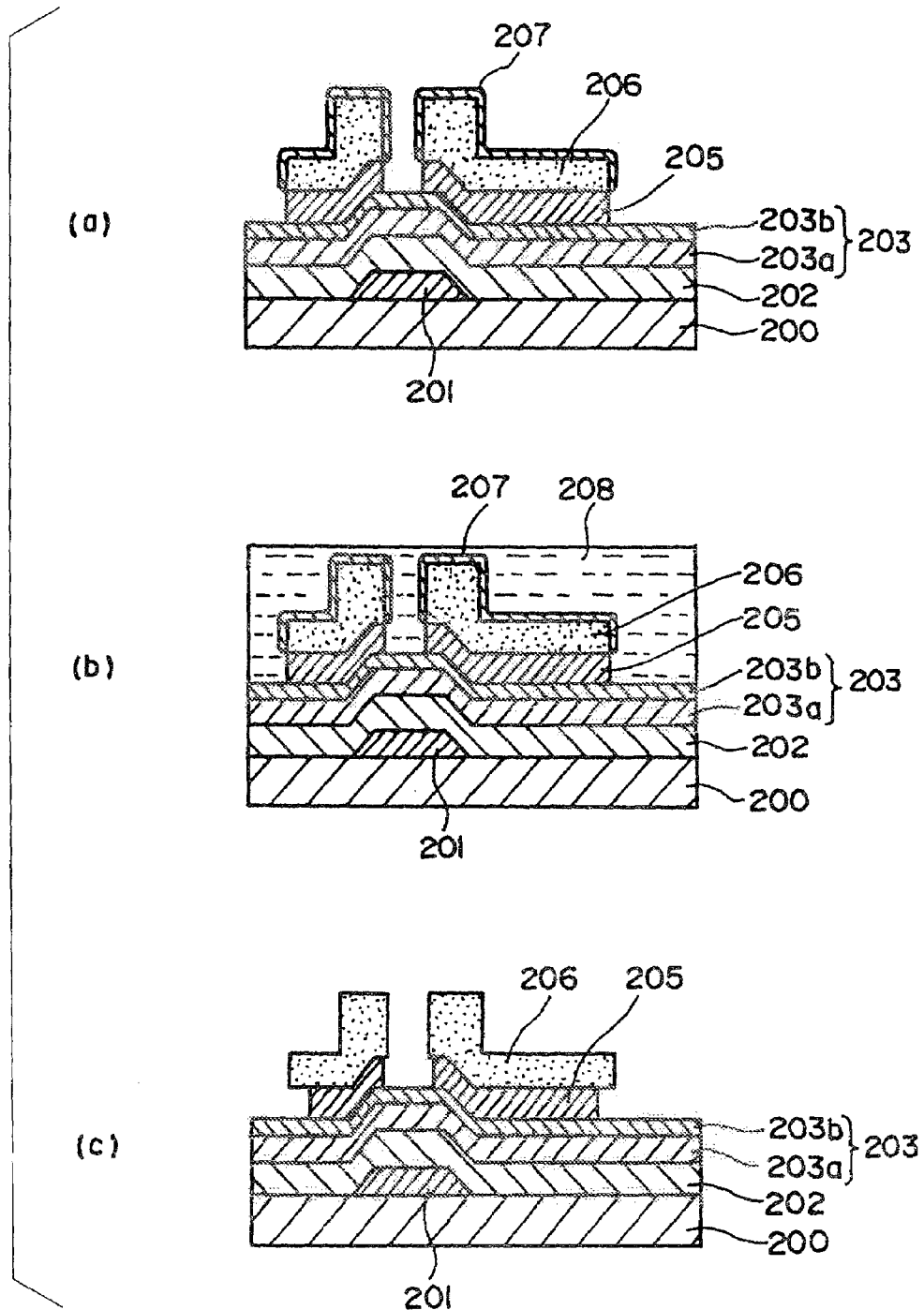
FIGS. 11(a), 11(b) and 11(c) are cross sections respectively showing states of a substrate, for explaining a problem which has been seen, in the past, in a pre-treatment of the reflow process for forming a TFT.
Figure 12:
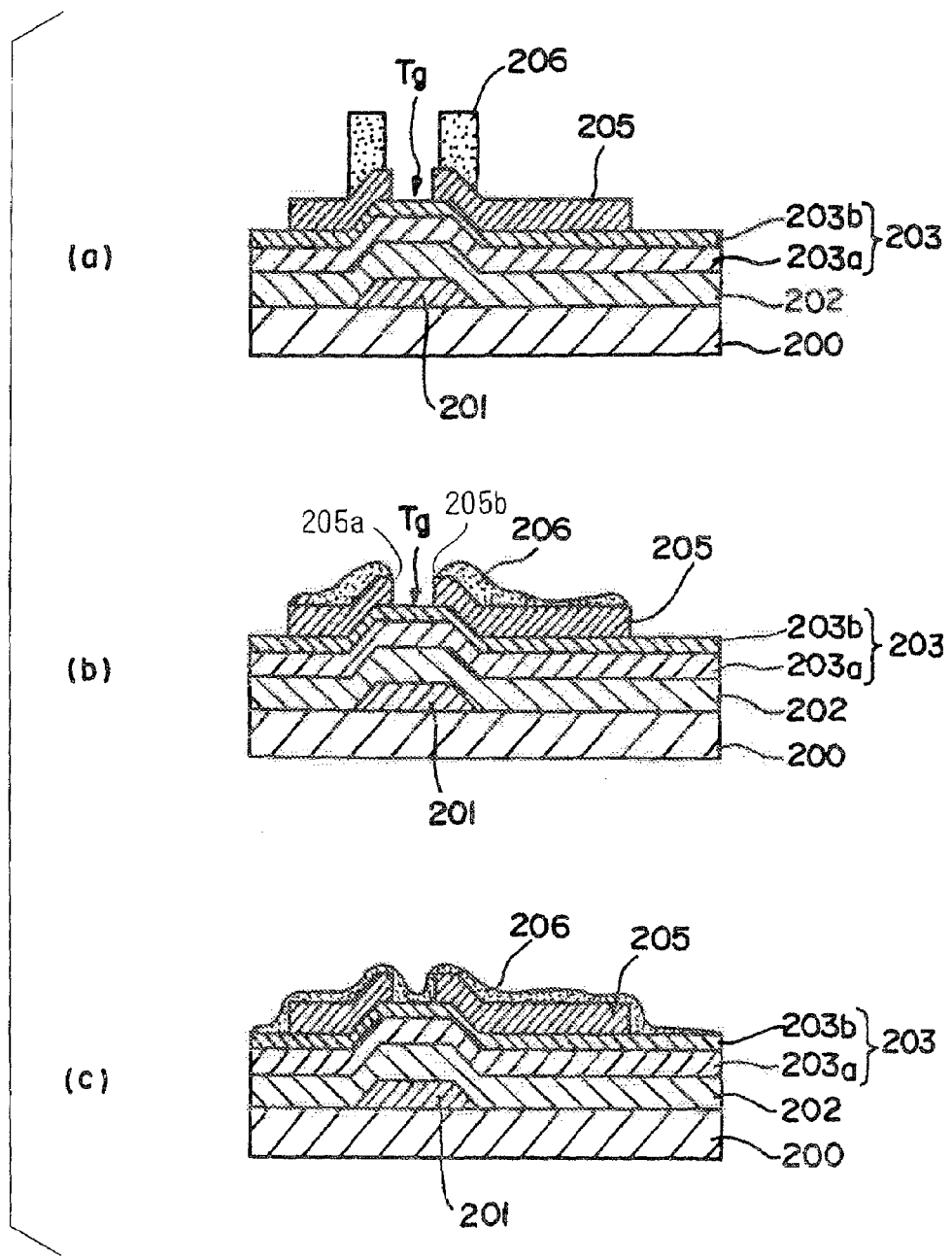
FIGS. 12(a), 12(b) and 12(c) are cross sections respectively showing states of a substrate, for explaining a problem which has been seen, in the past, in the reflow process for forming a TFT.

Subsequently, according to the flow chart of FIG. 3 and with reference to the cross sections of FIGS. 4 and 5 respectively showing each state of the substrate G, each step performed by the substrate processing apparatus 1 will be described. In FIGS. 4 and 5, like parts in the layers of the substrate described with reference to FIGS. 9 and 10 are denoted by like reference numerals.

First, a sheet of substrate G is transferred to the remover unit 5 via the substrate carrying unit 4 from the cassette station 2 in which substrates G carried from the etching apparatus 52 are received. As shown in FIG. 4(a), to the photoresist pattern 206 constituting the substrate G, a half exposing process is carried out, wherein photoresist portions to be required in the reflow process are formed into thicker films while unnecessary photoresist portions are formed into thinner films by using the coating and developing apparatus 50 and exposing apparatus 51. In this embodiment, reference character 206 designates a photoresist(s) and photoresist pattern(s) comprising the photo resist(s).

Figure 3:
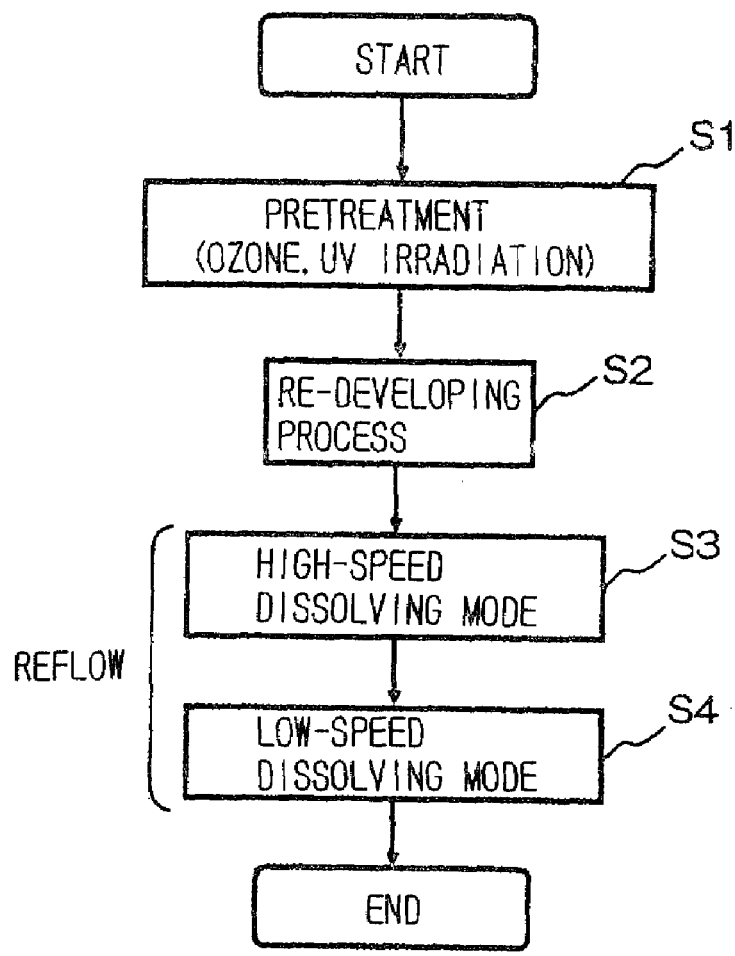
FIG. 3 is a flow chart showing steps of the method of processing a substrate, which employs the substrate processing apparatus in FIG. 1.

A pre-treatment is provided to the substrate G in the remover unit 5 to remove the degenerated layer 207 formed on the surface of the photoresist 206 by etching as shown in FIG. 4(a) (Step S1 in FIG. 3).

Specifically, as shown in FIG. 4(b), the atmosphere in the chamber (not shown) accommodating the substrate G is changed into an ozone atmosphere or atmosphere consisting of ozone, and the degenerated layer 207 is exposed to the ozone atmosphere so as to remove the degenerated layer 207 (film thickness: 100 to 200 Å) due to the effect of oxidation of ozone. More preferably, UV light is radiated onto the degenerated layer 207. In this way, the effect of oxidation and degradation due to ozone can be enhanced more effectively.

According to the pre-treatment method as described above, factors which may cause defectives, such as disconnection, can be eliminated, unlike the case of the conventional metal layer 205 wherein exposed portions (side portions) are dissolved by an alkaline liquid, thus causing side etching.

After the pre-treatment in the remover unit 5, the substrate G in the state shown in FIG. 4(c) is transferred to the re-developing unit 6 via the substrate carrying unit 4.

In the re-developing unit 6, a re-developing process is carried out to the substrate G in order to remove the photoresist 206 corresponding to unnecessary thinner resist film portions, thus leaving only the photoresist 206 corresponding to thicker resist film portions as shown in FIG. 5(a) (Step S2 in FIG. 3). Namely, this process can permit to leave only the resist 206 formed at a predetermined area to be masked around the target Tg.

Next, the substrate G is carried into the heat treating unit 8 via the substrate carrying unit 4 to carry out a predetermined heat treatment thereto, and it is then carried into the reflow unit 7 via the substrate carrying unit 4 to carry out a reflow process thereto by dissolving the photoresist 206, as such masking the target Tg.

The dissolving process of the photoresist 206 in the reflow unit 7 is carried out as will be described below. First, from the state of the photoresist 206 shown in FIG. 5(a) to the state of the photoresist 206 shown in FIG. 5(b), the dissolving process of the photoresist 206 is carried out in the high-speed dissolving mode as described above (Step S3 in FIG. 3). Namely, the dissolution of the photoresist 206 is controlled in the high-speed dissolving mode until the dissolved photoresist 206 reaches each stepped portion 205a, and thereafter the dissolved photoresist 206 passes through the stepped portion 205a formed at each edge portion 205b of the metal layer 205 which serves as a backing layer for the photoresist 206 so as to mask a predetermined area (i.e., the target Tg).

After the dissolved photoresist 206 reaches each stepped portion 205a, the dissolution of the photoresist 206 is controlled in the low-speed dissolving mode described above up to a final state of the pattern formation as shown in FIG. 5(c) (Step S4 in FIG. 3).

In such a way, by performing the low-speed dissolving mode after the dissolved photoresist 206 reaches each stepped portion 205a, overflow of the photoresist 206 can be controlled, and a resist film having a proper uniformity of the film thickness can be formed on the predetermined area (i.e. target Tg).

In the case where the predetermined area (i.e., target Tg) to be masked is relatively wide, the dissolution of photoresist 206 may be controlled such that it is dissolved in the low-speed dissolving mode only when a distal end of the photoresist 206 passes through the stepped portion 205a.

Namely, after the distal end of the photoresist 206 have passed through the stepped portion 205a, the photoresist 206 may be dissolved again in the high-speed dissolving mode. By doing so, the time required for the process can be reduced, and the film thickness of the resist pattern for masking the predetermined area can be further uniformed.

The substrate G including the resist pattern 206 which has been formed in the reflow unit 7 as described above is then carried into the heat treating unit 8 via the substrate carrying unit 4, so as to fix the resist pattern with heat. Thereafter, the substrate G is returned to the cassette in the cassette station 2 via the substrate carrying unit 4, and is then transferred to the etching apparatus 52.

As stated above, according to this embodiment of the present invention, in the step of the reflow process for masking a predetermined area by dissolving the photoresist 206 and having it pass through the stepped portion 205a formed at each edge portion 205b of the metal layer 205, the photoresist 206 is dissolved in the high-speed dissolving mode on the metal layer 205 and then it is dissolved in the low-speed dissolving mode after it reaches the stepped portion 205a.

With such a method, overflow of the photoresist 206 can be controlled, and a photoresist having a proper uniformity of the film thickness can be formed on the predetermined area (i.e. target Tg). The time required for the dissolving process can be reduced as compared with the case employing only the low-speed dissolving mode, and therefore the reflow process can be carried out with higher efficiency and in shorter time.

In the process for removing the degenerated layer 207, the removal of the degenerated layer 207 can be performed by exposing the degenerated layer 207 to an ozone atmosphere so as to utilize the effect of oxidation and degradation due to ozone. More preferably, UV light is radiated onto the degenerated layer 207. In this way, unlike the case of the conventional metal layer 205, side etching that exposed portions (side portions) of the metal layer are dissolved by an alkaline liquid can be eliminated, and factors which may cause defectives, such as disconnection, can be eliminated While in this embodiment a combination of exposing to an ozone atmosphere and use of UV light radiation has been described when removing degenerated layer 207 in the pre-treatment, the step is not limited to this aspect in the method of processing a substrate according to the present invention.

For example, the pre-treatment may be performed by supplying a pre-treating liquid to the substrate for removing the degenerated layer 207. Alternatively, in the pre-treatment, any one, a combination or all of the ozone atmosphere, UV light and a pre-treating liquid may be used.

EXAMPLES

Next, the method of processing a substrate according to the present invention will be further described based on several examples. In these examples, the substrate processing apparatus discussed in the above embodiment is used, and the effect of the present inventive method is reviewed by actually carrying out an experiment.

[Experiment 1]

In Experiment 1, influence of each parameter, i.e., the concentration and flow rate of the solvent atmosphere, substrate temperature and/or pressure in the treating chamber, for determining the high-speed dissolving mode (first dissolving-speed mode) and the low-speed dissolving mode (second dissolving-speed mode) in the reflow unit, on the solubility of the photoresist was examined through an experiment Specifically, the amount of spread of the photoresist was measured corresponding to changes of the respective parameters, i.e., the concentration and flow rate of the solvent atmosphere, substrate temperature and pressure in the treating chamber.

The term "amount of spread" is defined by ((the width of the resist after the reflow process)–(the width of the original resist))/2 (μm).

Figure 6:
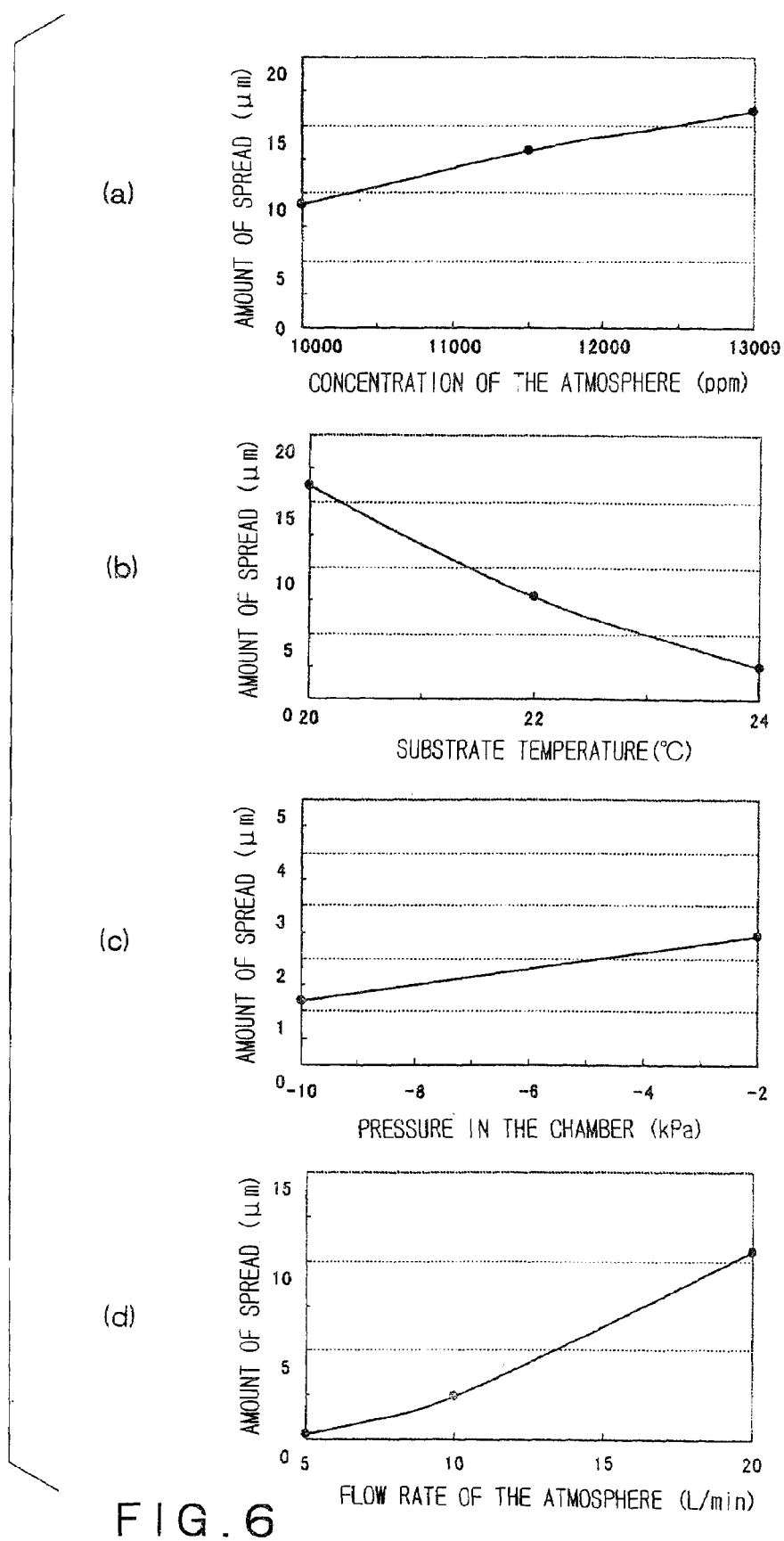
FIGS. 6(a), 6(b), 6(c) and 6(d) are graphs respectively showing results of Experiment 1 according to the present invention.

The results of this experiment are shown in FIGS. 6(a) to 6(d). FIG. 6(a) shows a change of the amount of spread of the photoresist corresponding to the concentration of the atmosphere, FIG. 6(*b*) expresses a change of the amount of spread of the photoresist corresponding to the substrate temperature, FIG. 6(*c*) shows a change of the amount of spread of the photoresist corresponding to the pressure in the treating chamber, and FIG. 6(*d*) designates a change of the amount of spread of the photoresist corresponding to the flow rate of the atmosphere.

It was found that the lower the temperature and/or the higher the pressure in the chamber and/or the more the flow rate of the atmosphere, the greater the amount of spread of the photoresist is. Accordingly, when adjusting the respective conditions to increase the amount of spread, the high-speed dissolving mode can be set, while when adjusting those conditions to decrease the amount of spread, the low-speed dissolving mode can be set.

[Experiment 2]

In Experiment 2, the effect of the method of processing a substrate according to the present invention was assessed by performing the reflow process for each of a plurality of processing conditions.

Specifically, the effect was assessed in the case of dissolving the photoresist consistently in the high-speed dissolving mode A, i.e., under Condition 1, while assessed in the case of dissolving the photoresist consistently in the low-speed dissolving mode B, i.e., under Condition 2.

Under Condition 3, the photoresist was dissolved in the high-speed dissolving mode A until it reached the stepped portion (the amount of spread was 1 μm), and was then dissolved in the low-speed dissolving mode B after it had passed through the stepped portion and then masked the target (the amount of spread was 2.5 μm).

Under Condition 4, the photoresist was dissolved in the low-speed dissolving mode B until it reached the stepped portion (the amount of spread was 1 μm), and was then dissolved in the high-speed dissolving mode A after it had passed through the stepped portion and then masked the target (the amount of spread was 2.5 μm).

In the high-speed dissolving mode A, the concentration of the atmosphere was 13000 ppm, the substrate temperature was 24° C., the pressure in the chamber was −2 kPa, and the flow rate of the atmosphere was 10 L/min, while in the low-speed dissolving mode B, the concentration of the atmosphere was 10000 ppm, the substrate temperature was 24° C., the pressure in the chamber was −2 kPa, and the flow rate of the atmosphere was 10 L/min.

For the respective Conditions 1 to 4, the amount of spread of the photoresist and the difference in the film thickness (uniformity) of the resist pattern formed with respect to the processing time were measured.

Figure 7:
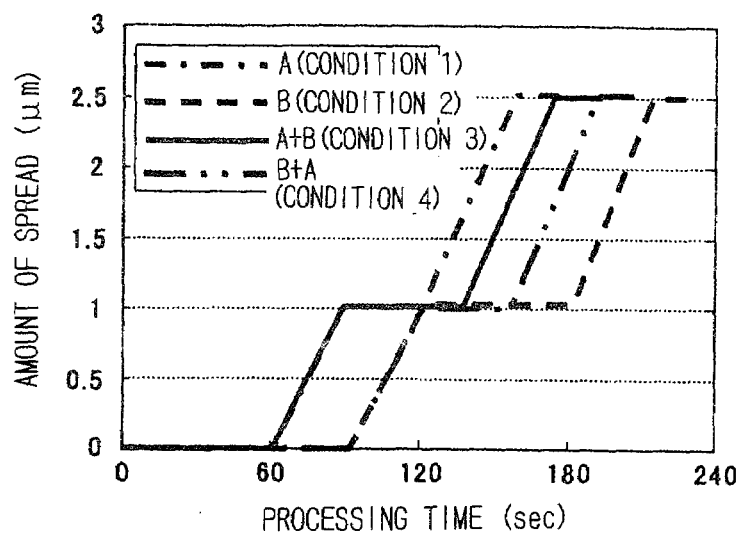
FIGS. 7(a) and 7(b) are graphs respectively showing results of Experiment 2 according to the present invention.
Figure 7:
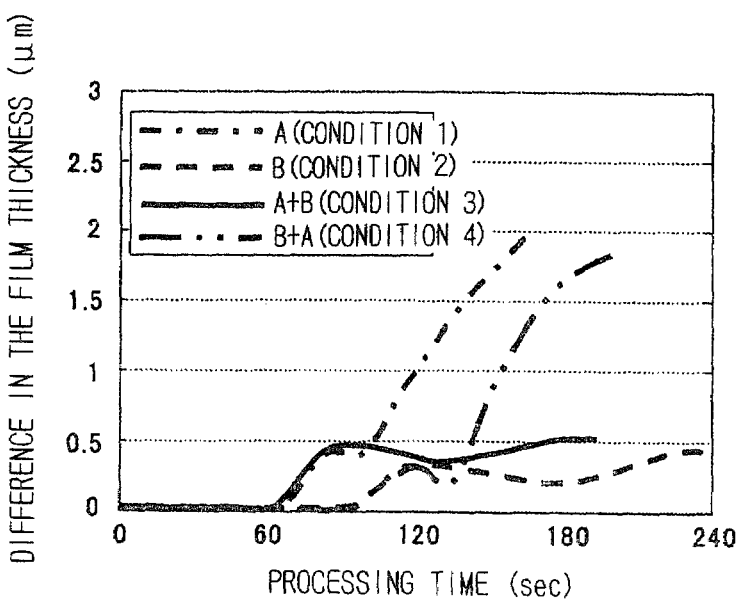

The results of this experiment are shown in FIGS. 7. FIG. 7(*a*) is a graph showing changes of the amount of spread of the photoresist with respect to the lapse of processing time for the respective Conditions 1 to 4, while FIG. 7(*b*) is a graph showing changes of the difference in the film thickness of the photoresist with respect to the lapse of processing time for the respective Conditions 1 to 4.

As shown in the graphs of FIGS. 7(*a*) and 7(*b*), it was found that while the processing time can be reduced under the Condition 1 (A), the difference in the film thickness was relatively large and non-uniform. It was found that while the difference in the film thickness was relatively small and proper uniformity can be provided under the Condition 2(B), the processing time was increased. On the other hand, under the Condition 3 (A+B) of the method of processing a substrate according to the present invention, it was found that the processing time was reduced greater than that found under the Condition 2 (B), as well as the difference in the film thickness was relatively small, thus providing acceptable uniformity. Under the Condition 4 (B+A), it was found that while the processing time could be reduced as compared with the Condition 2, the uniformity of the film thickness was deteriorated. It is believed that such deterioration of the uniformity may be caused by the high-speed dissolving mode which was employed when the photoresist passes through the stepped portion.

[Experiment 3]

In Experiment 3, the effect of the reflow process performed for a target area which is wider than the target area used in the Experiment 2 was assessed.

Specifically, the assessment was carried out under Condition 5 wherein the photoresist was first dissolved in the high-speed dissolving mode A until it reached the stepped portion (the amount of spread was 1 μm), and was then dissolved in the low-speed dissolving mode B until the distal end of the photoresist passed through the stepped portion, and after passing through the stepped portion, the photoresist was dissolved again in the high-speed dissolving mode A until it masked the target (the amount of spread was 4 μm).

In order to compare the results of the experiment, the same assessment was carried out also under Condition 3 which was employed in the Experiment 2 wherein the photoresist was dissolved in the high-speed dissolving mode A until it reached the stepped portion (the amount of spread was 1 μm), and was then dissolved in the low-speed dissolving mode B until it had passed through the stepped portion and then masked the target (the amount of spread was 4 μm).

For the respective Conditions 3 and 5, the amount of spread of the photoresist and the difference in the film thickness (uniformity) of the resist pattern formed with respect to the processing time were measured.

Figure 8:
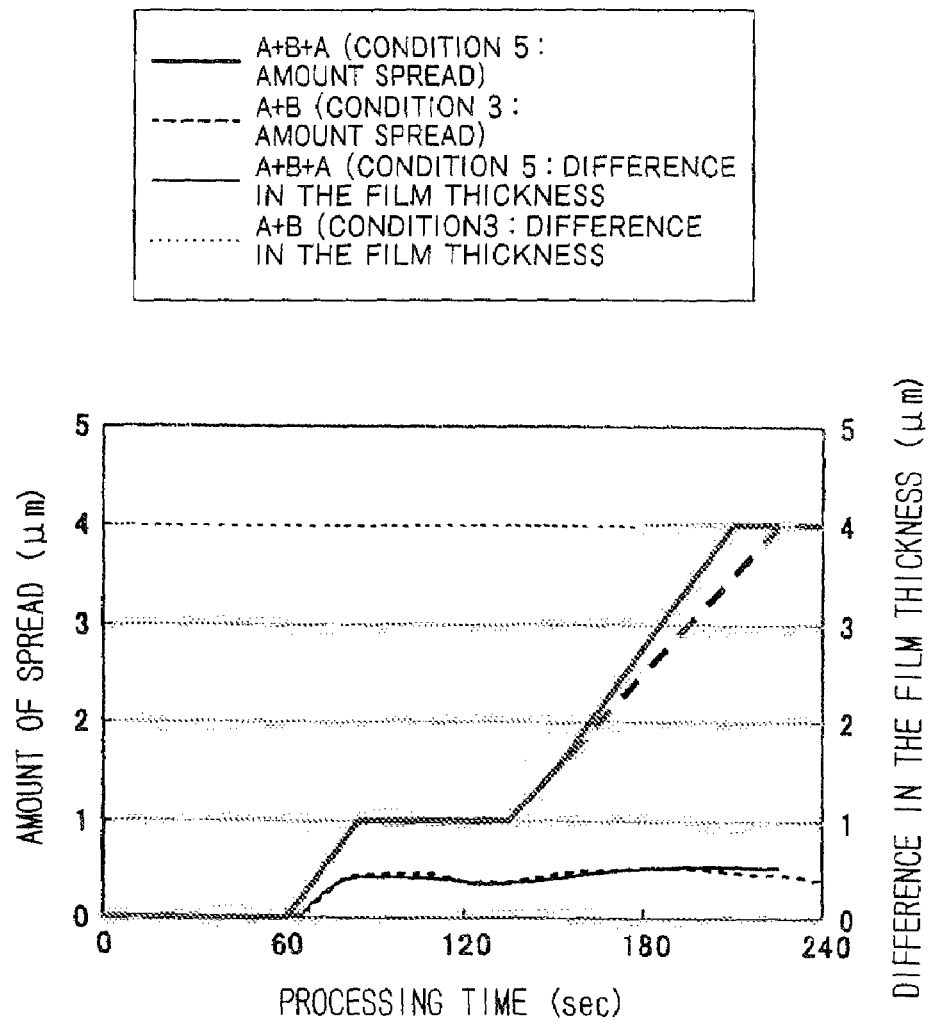
FIG. 8 is a graph showing results of Experiment 3 according to the present invention.

The results of this experiment are shown in FIG. 8. As shown in the graph of FIG. 8, with a wider target area, it was found that by dissolving the photoresist in the low-speed dissolving mode only when the distal end of the photoresist passed through the stepped portion as programmed in the Condition 5 (A+B+A), the processing time could be significantly reduced while keeping appropriate uniformity of the film thickness.

From the results of experiments of the example described above, it was found that according to the reflow process employing the method of processing a substrate of the present invention, a resist pattern having a proper uniformity of the film thickness can be formed with high efficiency on a predetermined area to be masked.

INDUSTRIAL AVAILABILITY

The present invention can be applied to a step of forming photoresist patterns many times, and be used advantageously in the art of producing electronic devices.

The invention claimed is:

1. A method of processing a substrate, which is adapted to form a new resist pattern by dissolving a photoresist of a used resist pattern which has been used as an etching mask for forming a backing layer having edge portions and includes at least thicker film portions and thinner film portions both formed by a half exposing process, the method comprising the steps of:

providing a re-developing process to the used photoresist pattern to remove the thinner film portions from the photoresist pattern; and further providing a re-developing process to the used photoresist pattern to dissolve the thicker film portions formed on the backing layer, to have the dissolved photoresist pass through a stepped portion formed at each edge portion of the backing layer, and masking a predetermined area of lower layers under the backing layer;

wherein in the step of masking the predetermined area by the photoresist, the photoresist is dissolved in a first dissolving-speed mode on the backing layer, and the photoresist is then dissolved in a second dissolving-speed mode after the photoersit to be dissolved reaches the stepped portion, the second dissolving-speed mode being slower than the first dissolving-speed mode.

2. The method of processing a substrate according to claim 1, wherein in the step of masking the predetermined area by the photoresist, after a distal end of the photoresist to be dissolved in the second dissolving-speed mode has passed through the stepped portion, the photoresist is dissolved again in the first dissolving-speed mode.

3. The method of processing a substrate according to claim 2, wherein in the step of masking the predetermined area by the photoresist, the photoresist is dissolved by exposing the photoresist to an atmosphere consisting of a solvent.

4. The method of processing a substrate according to claim 3, wherein in the step of masking the predetermined area by the photoresist, the first dissolving-speed mode and the second dissolving-speed mode are respectively determined, depending on any or a combination of the concentration of the solvent atmosphere, flow rate of the solvent atmosphere, substrate temperature and pressure in the treating chamber.

5. The method of processing a substrate according to claim 4, further comprising the step of:

removing a degenerated layer formed on the surface of the photoresist, by exposing it to an atmosphere consisting of ozone after the photoresist pattern has been used as an etching mask and before the step of removing the thinner film portions by the re-developing process.

6. The method of processing a substrate according to claim 3, further comprising the step of:

removing a degenerated layer formed on the surface of the photoresist by exposing it to an atmosphere consisting of ozone after the photoresist pattern has been used as an etching mask and before the step of removing the thinner film portions by the re-developing process.

7. The method of processing a substrate according to claim 2, further comprising the step of:

removing a degenerated layer formed on the surface of the photoresist by exposing it to an atmosphere consisting of ozone after the photoresist pattern has been used as an etching mask and before the step of removing the thinner film portions by the re-developing process.

8. The method of processing a substrate according to claim 1, wherein in the step of masking the predetermined area by the photoresist, the photoresist is dissolved by exposing the photoresist to an atmosphere of a solvent.

9. The method of processing a substrate according to claim 8, wherein in the step of masking the predetermined area, the first dissolving-speed mode and the second dissolving-speed mode are respectively determined, depending on any or a combination of the concentration of the solvent atmosphere, flow rate of the solvent atmosphere, substrate temperature and pressure in the treating chamber.

10. The method of processing a substrate according to claim 9, further comprising the step of:

removing a degenerated layer formed on the surface of the photoresist by exposing it to an atmosphere consisting of ozone after the photoresist pattern has been used as an etching mask and before the step of removing the thinner film portions by the re-developing process.

11. The method of processing a substrate according to claim 10, wherein in the step of removing the degenerated layer, the degenerated layer is further removed by radiating UV light onto the degenerated layer.

12. The method of processing a substrate according to claim 8, further comprising the step of:

removing a degenerated layer formed on the surface of the photoresist by exposing it to an atmosphere consisting of ozone after the photoresist pattern has been used as an etching mask and before the step of removing the thinner film portions by the re-developing process.

13. The method of processing a substrate according to claim 12, wherein in the step of removing the degenerated layer, the degenerated layer is further removed by radiating UV light onto the degenerated layer.

14. The method of processing a substrate according to claim 1, further comprising the step of:

removing a degenerated layer formed on the surface of the photoresist by exposing it to an atmosphere consisting of ozone after the photoresist pattern has been used as an etching mask and before the step of removing the thinner film portions by the re-developing process.

15. The method of processing a substrate according to claim 14, wherein in the step of removing the degenerated layer, the degenerated layer is further removed by radiating UV light onto the degenerated layer.

* * * * *